US 8,289,786 B2

(12) United States Patent
Huang et al.

(10) Patent No.: US 8,289,786 B2
(45) Date of Patent: Oct. 16, 2012

(54) DATA STORAGE USING READ-MASK-WRITE OPERATION

(75) Inventors: Henry F. Huang, Apple Valley, MN (US); Hai Li, Eden Prairie, MN (US); Yong Lu, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/240,359

(22) Filed: Sep. 22, 2011

(65) Prior Publication Data
US 2012/0008374 A1    Jan. 12, 2012

Related U.S. Application Data

(63) Continuation of application No. 12/903,023, filed on Oct. 12, 2010, now Pat. No. 8,040,743, which is a continuation of application No. 12/242,590, filed on Sep. 30, 2008, now Pat. No. 7,830,726.

(51) Int. Cl.
*G11C 7/22* (2006.01)
(52) U.S. Cl. .......... 365/189.14; 365/189.11; 365/189.07
(58) Field of Classification Search .......... 365/49.1, 365/49.17, 185.11, 189.07, 189.14
See application file for complete search history.

(56) References Cited

U.S. PATENT DOCUMENTS

| | | | |
|---|---|---|---|
| 5,276,800 A | 1/1994 | Wada | |
| 5,303,198 A | 4/1994 | Adachi et al. | |
| 5,999,441 A | 12/1999 | Runaldue et al. | |
| 6,147,890 A | 11/2000 | Kawana et al. | |
| 6,240,043 B1 | 5/2001 | Hanson et al. | |
| 6,490,664 B1 | 12/2002 | Jones et al. | |
| 6,531,371 B2 | 3/2003 | Hsu et al. | |
| 6,867,996 B2 | 3/2005 | Campbell et al. | |
| 6,870,755 B2 | 3/2005 | Rinerson et al. | |
| 6,871,272 B2 | 3/2005 | Butterworth | |
| 6,946,702 B2 | 9/2005 | Jang | |
| 7,067,865 B2 | 6/2006 | Lung | |
| 7,146,489 B2 | 12/2006 | Dowling | |
| 7,157,750 B2 | 1/2007 | Bulovic et al. | |
| 7,292,469 B2 | 11/2007 | Lee et al. | |
| 7,299,323 B2 | 11/2007 | Cho | |
| 7,376,015 B2 | 5/2008 | Tanaka et al. | |
| 7,417,881 B2 | 8/2008 | Srinivasan et al. | |
| 7,631,170 B2 | 12/2009 | Dowling | |
| 7,702,846 B2 | 4/2010 | Nakanishi et al. | |
| 7,830,726 B2 | 11/2010 | Huang et al. | |
| 2007/0246787 A1 | 10/2007 | Wang et al. | |
| 2007/0297223 A1 | 12/2007 | Chen et al. | |
| 2008/0037179 A1 | 2/2008 | Ito et al. | |

*Primary Examiner* — Gene Auduong
(74) *Attorney, Agent, or Firm* — Hall Estill Attorneys at Law

(57) ABSTRACT

Method and apparatus for writing data to a storage array, such as but not limited to an STRAM or RRAM memory array, using a read-mask-write operation. In accordance with various embodiments, a first bit pattern stored in a plurality of memory cells is read. A second bit pattern is stored to the plurality of memory cells by applying a mask to selectively write only those cells of said plurality corresponding to different bit values between the first and second bit patterns.

20 Claims, 3 Drawing Sheets

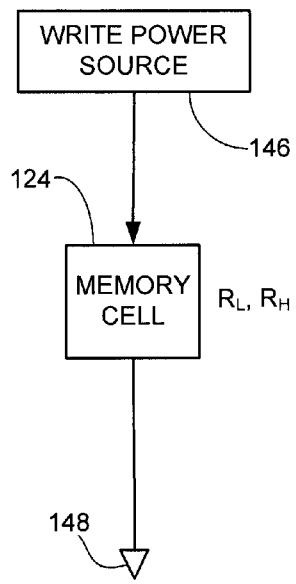
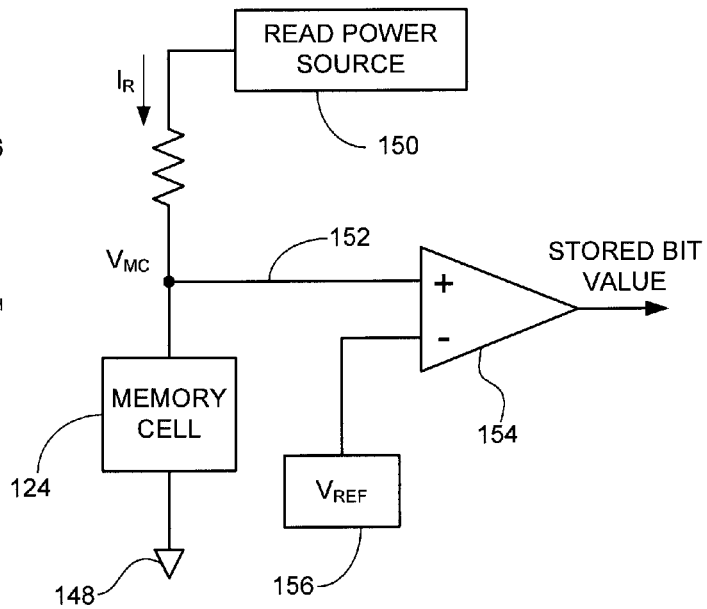
FIG. 3    FIG. 4
D(R) - EXISTING BIT PATTERN STORED IN MEMORY
160 — | 0 | 1 | 0 | 1 | 1 | 1 | 0 | 0 |
D(W) – NEW BIT PATTERN TO BE STORED IN MEMORY
162 — | 1 | 0 | 0 | 1 | 1 | 1 | 1 | 0 |
WRITE DATA MASK D(M) = D(R) XOR D(W)
164 — | 1 | 1 | 0 | 0 | 0 | 0 | 1 | 0 |
158
FIG. 5

DATA STORAGE USING READ-MASK-WRITE OPERATION

RELATED APPLICATION

This application is a continuation of U.S. patent application Ser. No. 12/903,023 filed Oct. 12, 2010 which is a continuation of U.S. patent application Ser. No. 12/242,590 filed Sep. 30, 2008, now U.S. Pat. No. 7,830,726 issued Nov. 9, 2010.

BACKGROUND

Data storage devices generally operate to store and retrieve data in a fast and efficient manner. Some storage devices utilize a semiconductor array of solid-state memory cells to store individual bits of data. Such memory cells can be volatile (e.g., DRAM, SRAM) or non-volatile (RRAM, STRAM, flash, etc.).

As will be appreciated, volatile memory cells generally retain data stored in memory only so long as operational power continues to be supplied to the device, while non-volatile memory cells generally retain data storage in memory even in the absence of the application of operational power.

In these and other types of data storage devices, it is often desirable to reduce power consumption requirements during operation, particularly with regard to the power required to write data to the storage array.

SUMMARY

Various embodiments of the present invention are generally directed to a method and apparatus for writing data to a storage array, such as but not limited to an STRAM or RRAM memory array, using a read-mask-write operation.

In accordance with some embodiments, a first bit with a first total number of bits is stored in a buffer memory and compared to a second bit pattern with a different second total number of bits stored in a selected location in the array. The first bit pattern is overwritten to the selected location by selectively writing only those memory cells at the selected location corresponding to different logical bit values between the respective first and second bit patterns.

These and various other features and advantages which characterize the various embodiments of the present invention can be understood in view of the following detailed discussion and the accompanying drawings.

BRIEF DESCRIPTION OF THE DRAWINGS

FIG. 3 generally illustrates a manner in which data are written to a memory cell of the memory array.

FIG. 4 generally illustrates a manner in which data are read from the memory cell of FIG. 3.

FIG. 5 shows a write data mask generated in accordance with various embodiments of the present invention.

DETAILED DESCRIPTION

Figure 1:
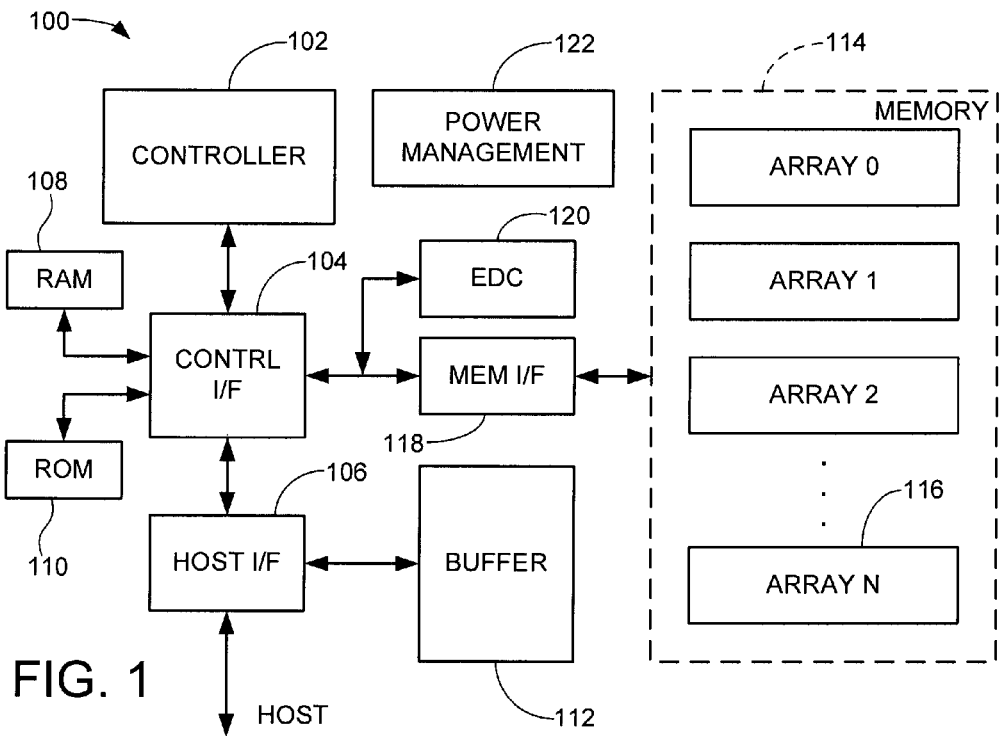
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustrating an exemplary embodiment and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, etc. is provided via random access memory (RAM) 108 and read-only memory (ROM) 110. A buffer 112 can be used as desired to temporarily store input write data from the host device and readback data pending transfer to the host device. The buffer can be a separate portion of the device, or can be incorporated into the memory space 114.

A memory space is shown at 114 to comprise a number of memory arrays 116 (denoted Array 0-N), although it will be appreciated that a single array can be utilized as desired. Each array 116 comprises a block of semiconductor memory of selected storage capacity. Communications between the controller 102 and the memory space 114 are coordinated via a memory (MEM) I/F 118. As desired, on-the-fly error detection and correction (EDC) encoding and decoding operations are carried out during data transfers by way of an EDC block 120.

While not limiting, in some embodiments the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host such as through the use of a USB-style interface, etc.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
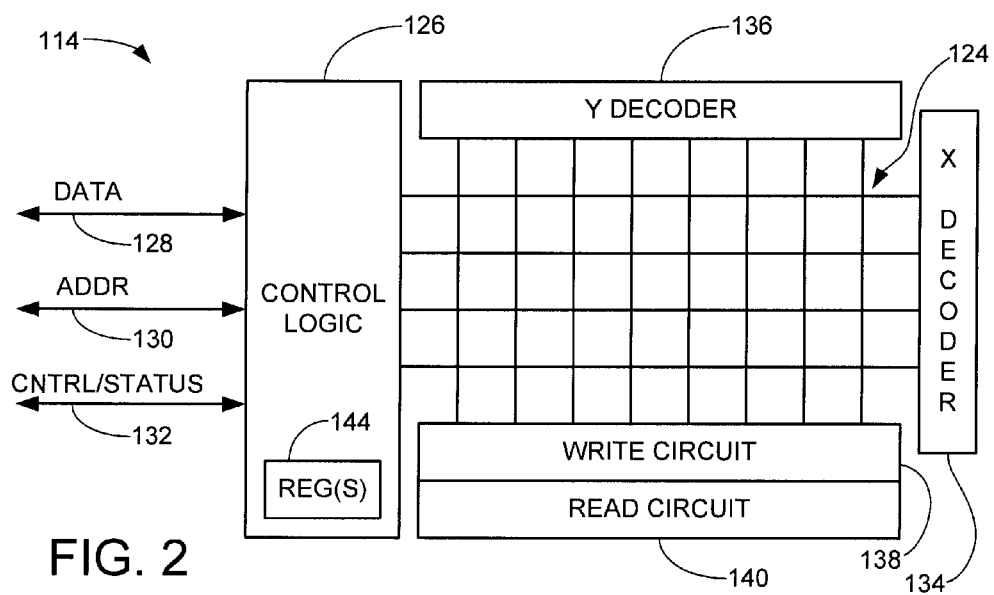
FIG. 2 shows circuitry used to read data from and write data to a memory array of the device of FIG. 1.

FIG. 2 provides a generalized representation of selected aspects of the memory space 114 of FIG. 1. Data are stored as an arrangement of rows and columns of memory cells 124, accessible by various row (word) and column (bit) lines, etc. In some embodiments, each of the array memory cells 124 has a spin-torque transfer random access memory (STTRAM or STRAM) configuration. However, it will be appreciated that such is not limiting, in that any number of different types of non-volatile or volatile memory cell constructions can be utilized, including but not limited to resistive RAM (RRAM), magnetoresistive RAM (MRAM), zero-capacitor RAM (ZRAM), static RAM (SRAM), non-volatile static RAM (nvSRAM), ferroelectric RAM (FeRAM), nano RAM (NRAM), phase-change RAM (PRAM), EEPROM, flash, dynamic RAM (DRAM), etc.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 2 is merely exemplary in nature, and any number of alternative configurations can readily be employed as desired depending on the requirements of a given application.

Data are written to the respective memory cells 124 as generally depicted in FIG. 3. Generally, a write power source 146 applies the necessary input (such as in the form of current, voltage, magnetization, etc.) to configure the memory cell 124 to a desired state. It can be appreciated that FIG. 3 is merely a representative illustration of a bit write operation. The configuration of the write power source 146, memory cell 124, and reference node 148 can be suitably manipulated to allow conventional writing of a bit with a variety of memory devices (such as SRAM, STRAM, RRAM, flash, etc).

As noted above, in some embodiments the memory cell 124 takes an STRAM configuration, in which case the write power source 146 is characterized as a bi-directional current driver connected through a memory cell 124 to a suitable reference node 148, such as ground. The write power source 146 provides a stream of power that is spin polarized by moving through a magnetic material in the memory cell 124. The resulting rotation of the polarized spins creates a torque that changes the magnetic moment of the memory cell 124.

Depending on the orientation of the applied write current, the cell 124 will take either a relatively low resistance ($R_L$) or a relatively high resistance ($R_H$). While not limiting, exemplary $R_L$ values may be in the range of about 100 ohms ($\Omega$) or so, whereas exemplary $R_H$ values may be in the range of about 100K$\Omega$ or so Other resistive memory type configurations (e.g., RRAMs) are supplied with a suitable voltage or other input to similarly provide respective $R_L$ and $R_H$ values. These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

The logical bit value(s) stored by each cell 124 can be determined in a manner such as illustrated by FIG. 4. A read power source 150 applies an appropriate input (e.g., a selected read voltage) to the memory cell 124. The amount of read current $I_R$ that flows through the cell 124 will be a function of the resistance of the cell ($R_L$ or $R_H$, respectively). In the case of STRAM, as well as other types of memory configurations such as RRAM, the read current magnitude will be generally be significantly lower than the write current magnitude utilized to set the storage state of the bit. The voltage drop across the memory cell (voltage $V_{MC}$) is sensed via path 152 by the positive (+) input of a comparator 154. A suitable reference (such as voltage reference $V_{REF}$) is supplied to the negative (−) input of the comparator 154 from a reference source 156.

The reference voltage $V_{REF}$ is selected such that the voltage drop $V_{MC}$ across the memory cell 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the memory cell 124.

FIG. 5 illustrates an exemplary write data mask operation 158 carried out in accordance with an embodiment. The existing bit pattern stored in memory 160 is read and compared to a new bit pattern to be stored in memory 162. The comparison of the new bit pattern 162 in relation to the existing bit pattern 160 is conducted through the operation of an exclusive or (XOR) function 164. It should be noted that various comparison techniques can be employed among numerous bit values to discern the differences between existing and new bit patterns 160 and 162. However, the use of an XOR function 164 results in an output of a 0 for every new bit value that is equivalent to the existing bit value and a 1 for every new bit value that is different than the existing bit value. In this embodiment, the write data mask 158 can be implemented to write only the bit values needed to render the new bit pattern 162 from the existing bit pattern 160.

After the write data mask operation 158 of FIG. 5 compares the existing and new bit patterns, the mask will output a bit pattern indicating which bits differ. The outputted mask bit pattern can be used to set write enable/disable inputs for the respective cells. A mask bit value of 1 indicates the corresponding existing bit needs to be switched, whereas a mask bit pattern bit value of 0 indicates no write process is required for that bit. The advantageous implementation of the write data mask with existing solid state memory requiring switch bit commands can readily be understood due to the ability of the write data mask to reduce the number of bits written by masking certain bits of equivalent values.

It is contemplated that the masking operation may result in bits being written of opposite logical polarity; for example, at least one bit may be changed from a 0 to 1 whereas at least one other bit may be changed from a 1 to a 0 during a given write operation. There is no general limitation to size of bit pattern (e.g. 4-bit, 16-bit, 128-bit, etc.) that can be used, and multiple bits can be stored per cell. The existing and new bit patterns 160, 162 are equal in number of bits, although such is not necessarily required.

Figure 6:
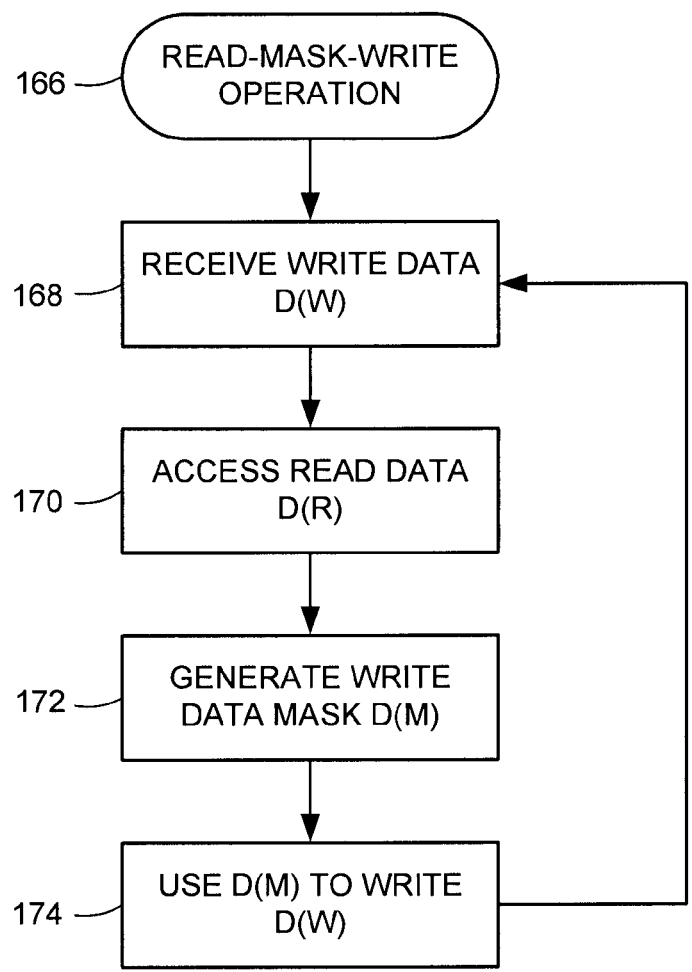
FIG. 6 sets forth a READ-MASK-WRITE OPERATION routine generally illustrative of steps carried out in accordance with various embodiments of the present invention to write data to a memory array.

An exemplary flow diagram for a READ-MASK-WRITE OPERATION routine 166 is set forth by FIG. 6. New write data D(W) are received at step 168 to be stored to a selected location in memory. Reception of the write data D(W) results in an access operation at step 170 to recover the contents stored at the selected location. While step 170 involves the reading of the plurality of cells in the storage array, alternatively a local buffer, register or other memory location with the same contents as the storage array can be accessed as desired.

A write data mask D(M) is next generated at step 172 in relation to the respective data D(W) and D(R). As noted above, this is carried out in some embodiments using an XOR operation (i.e., D(M)=D(W) XOR D(R)), although other suitable methodologies can be used as desired. The resultant write data mask is utilized at step 174 to write those bits necessary at the selected location such that, at the completion of the data write operation 174, the write data D(W) are stored in the selected location. The routine then returns to step 168 as shown and continues as new write data are presented for storage.

Figure 7:
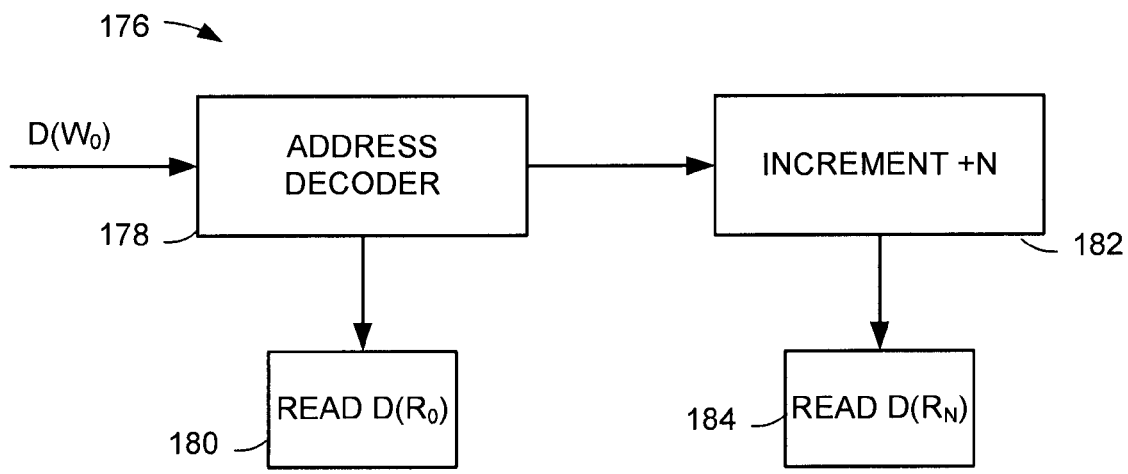
FIG. 7 shows circuitry used to prefetch read data during a write operation in accordance with various embodiments of the present invention.

In some embodiments, the device 100 further includes predictive read look ahead circuitry 176 as generally depicted FIG. 7. An address decoder 180 identifies the destination address within the array (in this case, address "0") associated with received write data DW0. In response, a read block 180 operates to identify the data currently stored at this address (i.e., $D(R_0)$) in a manner such as set forth above.

An increment circuit 182, such as a counter, identifies the next address (e.g., address N) for the next set of write data $D(W_N)$. This new address N may be a prediction of the next address based on previous address sequencing, or may be based on write data that has been physically received by the device 100, such as data pending in buffer 112 (FIG. 1) or some other location (e.g., registers 144 in FIG. 2). A look-ahead read operation is carried out by block 184 to read the corresponding data $D(R_N)$ at the look-ahead address. In this way, write efficiencies can be improved by reducing the time required to access the existing data for a given mask generation operation.

It should be noted that the increment block can search various locations or bit pattern sizes to accommodate the most efficient read ahead operation. In an alternative embodiment, the increment block can designate a read operation for non-sequential data. Likewise, a range of bit sectors can be read, written with the write data mask, and concurrently incremented and read. For example, small blocks, such as 8 bits of data, as well as large blocks, such as 512 byte sectors, can undergo the operation of FIGS. 6 and 7. Further, a given read-mask-write operation can be performed on an entire sector at once, or divided into smaller segments to be written sequentially. In this latter case, it will be clearly known which data will need to be read next by utilizing the look ahead ability of the increment block 180.

The various embodiments illustrated herein provide advantages in both time and power savings. The ability to concurrently read data ahead while writing a bit pattern using a write data mask allows more efficient use time spent reading data. Moreover, the writing of the minimum number of bit values necessary to render a new bit pattern associated with the use of the write data mask significantly reduces the power consumption over conventional data write processes. For many solid state data storage devices such as MRAM, STRAM, and RRAM, the power consumption is considerably greater for a write operation than for a read operation. Thus, a minimization of the number of bit values to be written for a given amount of data allows for extensive power savings over conventional data write operations. However, it will be appreciated that the various embodiments discussed herein have numerous potential applications and are not limited to a certain field of electronic media or type of data storage devices.

In various embodiments, the plurality of memory cells are capable of being individually written to without having to reset a block of memory cells and concurrently write said block of memory cells, such as so-called resistive sense memory (RSM) cells which include MRAM, STRAM and RRAM cells. This excludes other types of erasable cells such as EEPROM and flash, which require an erase operation to reset the storage state of the cells prior to a write operation. Moreover, erasable cells can only be written to a single value (e.g., all cells are initially set to logical 0 and then selectively written to 1) whereas RSM cells can be alternatively written from any first state (e.g., logical state 0 or 1) to a second state (e.g., logical state 1 or 0).

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A non-volatile data storage device comprising an array of memory cells, a buffer memory, and a control circuit adapted to store in the buffer memory a first bit pattern having a first total number of bits, to compare the first bit pattern to a second bit pattern having a different second total number of bits stored in a selected location in the array, and to overwrite the first bit pattern to the selected location by selectively writing only those memory cells at the selected location corresponding to different logical bit values between the respective first and second bit patterns.

2. The data storage device of claim 1, in which the first total number of bits in the first bit pattern is greater than the second total number of bits in the second bit pattern.

3. The data storage device of claim 1, in which the first total number of bits in the first bit pattern is less than the second total number of bits in the second bit pattern.

4. The data storage device of claim 1, in which multi-bit logical values are written to the memory cells at the selected location.

5. The data storage device of claim 1, in which the first bit pattern is characterized as a first set of write data to be written to the array and the second bit pattern is characterized as a first set of read data retrieved from the array.

6. The data storage device claim 1, in which the selected location is characterized as a physical block address of the array constituting a plurality of adjacent resistive random access memory (RRAM) cells in the array, and the control circuit comprises an address decoder adapted to identify a physical block address for the first bit pattern responsive to a logical block address supplied to the data storage device by a host.

7. The data storage device of claim 6, in which the control circuit further comprises an increment circuit adapted to predict a next physical block address in the array for a third bit pattern not yet received by the data storage device from the host, and a read circuit adapted to perform a read-look-ahead operation to retrieve a fourth bit pattern from the array at the next physical block address responsive to said prediction.

8. The data storage device of claim 1, in which the control circuit generates a bit mask which identities those cells at the selected location corresponding to different logical bit values between the respective first and second bit patterns, and in which the control circuit overwrites the first bit pattern to the selected location responsive to the bit mask.

9. A solid-state memory structure comprising:
a plurality of non-volatile resistive random access memory (RRAM) cells arranged into addressable groups of cells each group having a unique physical block address;
a buffer memory adapted Lo temporarily store a set write data received from a host pending transfer to a selected physical block address of the array, the set of write data having a first overall bit length; and
a control circuit adapted to retrieve a set of read data previously stored to the selected physical block address, compare the retrieved set of read data to the set of write data in the buffer memory, and to overwrite the set of write data to the selected physical block address by selectively writing only those RRAM cells at the selected location corresponding to different logical bit values between the respective sets of write and read data, the set of read data having a different second overall bit length.

10. The memory structure of claim 9, in which the control circuit is further adapted to concurrently perform a read-look-ahead operation to retrieve a second set of read data from the array responsive to the selected physical block address associated with the set of write data.

11. The memory structure of claim 10, in which the control circuit is further adapted to compare the retrieved second set of read data to a second set of write data received from the host concurrently with the overwriting of the set of write data to the selected physical block address.

12. The memory structure of claim 9, in which the control circuit Directs the overwriting of the set of write data to the selected physical block address by writing a first logical value to a first selected RRAM cell, by writing a different, second logical value to a second selected RRAM cell, and by not writing a logical value to a third selected RRAM cell so that the third selected RRAM cell maintains a preexisting programmed logical value, the preexisting programmed logical value forming a portion of the set of write data stored in the selected physical block address.

13. The memory structure of claim 9, in which the set of read data and the set of write data share a common logical block address (LBA).

14. The memory structure of claim 9, in which the control circuit generates a bit mask which identifies those RRAM cells at the selected physical block address in the array corresponding to different logical bit values between the respective sets of write and read data, the control circuit overwriting the set of write data to the selected physical block address responsive to the generated bit mask.

15. A method comprising:
   writing a first set of data to a selected set of resistive sense memory (RSM) cells at a selected address in a non-volatile memory array responsive to first set of data from a host device, the first set of data having a first total number of bits; and
   overwriting the selected set of RSM cells with a different, second set of data responsive to receipt of the second set of data from the host device by reading the first set of data from the selected set RRAM cells, comparing the first set of data with the second set of data. and selectively writing only those RRAM cells in the selected set of RRAM cells corresponding to different logical bit values between the respective first and second sets of data, wherein the second set or data have a second total number of bits different from the first total number of bits.

16. The method of claim 15, in which the writing step comprises temporarily storing the first set of data from the host device in a buffer memory, and subsequently transferring the first set of data from the buffer memory to the selected set of RRAM cells.

17. The method of claim 16, in which the overwriting step comprises temporarily storing the second set of data from the host device in said buffer memory, and copying the first set of data from the selected set of RRAM cells to the buffer memory.

18. The method of claim 15, further comprising steps of predicting a next destination address for a third set of write data not yet received from the host, and reading a fourth set of data from a second selected set of RSM cells in the array corresponding to the next destination address.

19. The method of claim 15, in which the comparing step comprises generating a bit mask by applying an exclusive-or (XOR) function to the first and second sets of data.

20. The method of claim 15, in which the RSM cells are characterized as resistive random access memory (RRAM) cells.

* * * * *